United States Patent [19]

Uehara et al.

[11] Patent Number: 4,460,674
[45] Date of Patent: Jul. 17, 1984

[54] POSI-TYPE QUINONE DIAZIDE PHOTOSENSITIVE COMPOSITION WITH SENSITIZER THEREFOR

[75] Inventors: Masafumi Uehara; Takeshi Yamamoto; Atsuo Yamazaki; Tohru Aoki, all of Hino, Japan

[73] Assignee: Konishiroku Photo Industry Co., Ltd., Tokyo, Japan

[21] Appl. No.: 336,861

[22] Filed: Jan. 4, 1982

[30] Foreign Application Priority Data

Jan. 16, 1981 [JP] Japan .................................. 56-3778
Jan. 16, 1981 [JP] Japan .................................. 56-3779

[51] Int. Cl.$^3$ .......................... G03C 1/60; G03C 1/54
[52] U.S. Cl. .................................... 430/190; 430/189; 430/191; 430/192; 430/302; 430/326
[58] Field of Search ............... 430/191, 190, 193, 189, 430/326, 192, 302

[56] References Cited

U.S. PATENT DOCUMENTS 4,115,128 9/1978 Kita ...................................... 430/165
4,174,222 11/1979 Komine et al. ...................... 430/193

FOREIGN PATENT DOCUMENTS 1075066 8/1980 Canada ................................ 430/191
2461912 7/1976 Fed. Rep. of Germany ...... 430/189
332413 4/1972 U.S.S.R. .............................. 430/191

OTHER PUBLICATIONS

Hamel, C. J. et al., *IBM Technical Disclosure Bulletin*, vol. 18, No. 6, 11/1975, p. 1775.

*Primary Examiner*—Charles L. Bowers, Jr.
*Attorney, Agent, or Firm*—Frishauf, Holtz, Goodman & Woodward

[57] ABSTRACT

A posi-type photosensitive composition having enhanced sensitivity is prepared by incorporating a specific sensitizer selected from gallic acid, its derivative, naphthoquinone compound and its derivative in a quinonediazide type photosensitive material. The composition is free from lowering in development tolerance and other properties.

18 Claims, No Drawings

POSI-TYPE QUINONE DIAZIDE PHOTOSENSITIVE COMPOSITION WITH SENSITIZER THEREFOR

This invention relates to a posi-type photosensitive composition suitable for the production of lithographic printing plates, proofs for multicolor printing, IC circuits or photomasks, particularly to a posi-type photosensitive composition sensitized by incorporation of a specific sensitizer to a photosensitive composition containing a quinonediazide compound. More particularly, it pertains to a posi-type photosensitive composition sensitized without deleterious effects on development tolerance.

Photosensitive compositions containing quinonediazide compounds have been utilized as excellent posi-type photosensitive composition in commercial applications such as production of lithographic printing plates and photoresists. In the prior art, there have been made various proposals about the method to enhance photosensitivity of such quinonediazide type posi-type photosensitive compositions, but no satisfactory composition has yet been obtained.

For example, decrease in amount of a quinonediazide compound will of course result in increase of sensitivity, but development tolerance at the time of developing (i.e. time span for attaining optimum development; the term means the same hereinafter) is narrowed at the same time to be disadvantageously unpractical. A system in which a quinonediazide compound is combined with a binder resin having greater solubility in an aqueous alkaline solution can also increase apparent sensitivity, but it also involves the defect of narrowed development tolerance similarly as in case of the foregoing method. There is also proposed a technique in which a non-photosensitive compound (sensitizer) is incorporated in a photosensitive composition containing a quinonediazide compound to enhance sensitivity. But no successful effect has been achieved and there remain presently various drawbacks to be overcome.

For example, as disclosed in U.S. Pat. No. 3,661,582, a specific class of heterocyclic compounds such as 2-azacyclononan-2-one, indole, quinazoline and tetrazole can be added to enhance sensitivity, but only to afford an extremely narrow development tolerance similarly as described above.

Japanese Patent Publication No. 42449/1971 discloses various additives for enhancement of photographic photosensitivity, including, for example, triphenylmethane dyes, benzaldehyde-m-tolylhydrazone, halogenated hydrocarbons and azo dyes, but these compound have no marked effect of sensitization.

Addition of o-benzoic acid sulfimide, hydantoin and derivatives thereof, thiohydantoin and derivatives thereof has also been proposed (see Japanese Provisional Patent Publication No. 36203/1975) for the same purpose. Further, additives of cyclic acid anhydrides have also been proposed for the same purpose (see Japanese Provisional Patent Publication No. 80022/1977 and also "Comparative example 2" as hereinafter described). Also in these cases, at levels of addition where enhancement of sensitivity can be recognized, the development tolerance at the time of developing is unpractically extremely narrow. Further, there is also proposed a photosensitive duplicating material containing polyhydroxybenzophenone (see Japanese Provisional Patent Publication No. 54503/1977), but said compound is added for improvement of adhesiveness to a support. Enhancement of sensitivity results concomitantly in connection with such an improvement, and hence no marked sensitization is effected. Addition of a condensation product between hydroxybenzophenone and formaldehyde has also been proposed for the purpose of enhancement of sensitivity (see Japanese Provisional Patent Publication No. 73045/1980 and also "Comparative example 3" as hereinafter described). In this case, similarly as in the case of the aforesaid compound in Japanese Provisional Patent Publication No. 54503/1977, a considerable amount of additives is required to be added for appreciable enhancement of sensitivity, whereby as a matter of course development tolerance and chemical resistance will be lowered.

Therefore, the object of the present invention is to provide a posi-type photosensitive composition which can improve sensitivity of a quinonediazide type photosensitive material without affecting disadvantageous effects on other important properties such as development tolerance by incorporation of a specific additive therein.

Other objects of the present invention will become apparent as the description proceeds in the specification.

The above object of the present invention is accomplished by a posi-type photosensitive composition, comprising a quinonediazide type posi-type photosensitive compound and at least one sensitizer represented by the formula (I) or (II) shown below:

General formula (I):

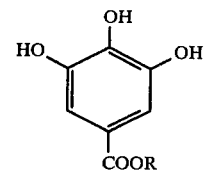

General formula (II):

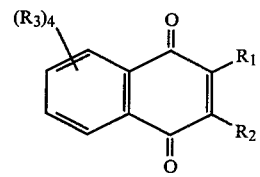

In the above formula (I), R represents a hydrogen atom, an alkyl group, an aralkyl group, an aryl group, a substituted aryl group, a cycloalkyl group or an alkali metal atom.

In the above general formula (II), each of $R_1$, $R_2$ and $R_3$ represents a hydrogen atom, an alkyl group, an alkoxy group, an aryl group, a substituted aryl group, an acyl group, a halogen atom, a nitro group or a hydroxyl group, with proviso that plural number of $R_3$ groups may either be identical with each other or a combination of different kinds of groups.

In the above general formula (I), as the alkyl group represented by R, preferably there may be mentioned those having 1 to 18 carbon atoms, more preferably those having 1 to 4 carbon atoms. They may either be straight or branched. Typical examples of the alkyl group are methyl, ethyl, i-propyl, t-butyl, i-amyl, n-hexyl, n-octyl, lauryl, cetyl and stearyl. As the aralkyl group, preferably there may be mentioned benzyl, phenethyl, 3-phenylpropyl and 2-naphtylmethyl. As the aryl group or the aryl group in the substituted aryl group, preferably there may be mentioned phenyl, naphthyl, anthryl and phenanthryl. As the substituents in the substituted aryl groups, preferably there may be mentioned lower alkyl groups (1 to 4 carbon atoms), alkoxy groups (1 to 4 carbon atoms), acyl groups (2 to 4 carbon atoms), halogens (chlorine, bromine, etc.), nitro group, hydroxyl group and carboxyl group. Two or more substituent groups as mentioned above may be contained or combined. As the cycloalkyl group, preferably there may be mentioned cyclopropyl, cyclopentyl or cyclohexyl. The alkali metal atom preferably may include lithium, sodium, potassium or rubidium.

In the above formula (II), as the alkyl group, the aryl group, or the substituted aryl group represented by $R_1$, $R_2$ or $R_3$, there may be mentioned those as mentioned above with respect to R. As the alkoxy group represented by $R_1$, $R_2$, or $R_3$, preferably there may be mentioned those having 1 to 12 carbon atoms. Typical examples of the alkoxy group are methoxy, ethoxy, isopropoxy, t-butoxy and the like. Among them, methoxy and ethoxy are preferred. As the acyl group represented by $R_1$, $R_2$ or $R_3$, preferably there may be mentioned those having 2 to 8 carbon atoms. As the acyl group, there may be mentioned acetyl, propionyl, butyryl, benzoyl, etc. As the halogen atom represented by $R_1$, $R_2$ or $R_3$, there may be mentioned fluorine, chlorine, bromide, iodine, etc., preferably chlorine and bromine. In the above formula (II), $R_1$, $R_2$ and $R_3$ may be identical with each other or different from each other, or may have the same or different substitutents, and it is possible to employ any desired combination of such groups.

The preferable quinonediazide type posi-type photosensitive compound to be used in the present invention is selected from the group consisting of an ester obtained by reacting 1,2-diazobenzoquinonesulfonyl chloride or 1,2-diazonaphthoquinonesulfonyl chloride with phenolic hydroxyl group containing compound and an amide obtained by reacting 1,2-diazobenzoquinonesulfonyl chloride or 1,2-diazonaphthoquinonesulfonyl chloride with an aromatic amine. As the phenolic hydroxyl group containing compound mentioned above, preferably there may be mentioned phenols, and condensation products of phenols with aldehydes or ketones. As the phenols mentioned above, there may be mentioned phenol, cresol, bisphenol A, cumylphenol, resorcin, p-t-butylphenol, pyrogallol, etc. As the aldehyde mentioned above, there may be mentioned formaldehyde, acetaldehyde, benzaldehyde, p-nitrobenzaldehyde, butylaldehyde, etc. As the ketone mentioned above, there may be mentioned acetone, methylethylketone, acetophenone, benzophenone, etc.

The most preferable quinonediazide compound to be used in the present invention is an ester obtained by reacting 1,2-diazobenzoquinonesulfonyl chloride with a polyhydroxyphenyl or an ester obtained by reacting 1,2-diazonaphthoquinonesulfonyl chloride with a resorcin-bezaldehyde resin. As other preferable quinonediazide compounds, there may be mentioned an ester obtained by reacting 1,2-diazobenzoquinonesulfonyl chloride or 1,2-diazonaphthoquinonesulfonyl chloride with a phenol-formaldehyde resin, as disclosed in U.S. Pat. Nos. 3,046,120 and 3,188,210, an ester obtained by reacting 1,2-diazonaphthoquinonesulfonyl chloride with a condensation product of pyrogallol and acetone as disclosed in U.S. Pat. No. 3,635,709. Other useful quinonediazide compounds are also known and reported in a number of Patent Publications, as in Japanese Provisional Patent Publications Nos. 5303/1972, 63802/1973, 63803/1973, 96575/1973, 13354/1973, 38701/1974; Japanese Patent Publications Nos. 11222/1966, 9610/1970, and 17481/1974; U.S. Pat. Nos. 2,797,213, 3,454,400, 3,544,323, 3,573,917, 3,674,495, and 3,785,825; U.K. Pat. Nos. 1,227,602, 1,251,345, 1,267,005, 1,329,888 and 1,330,932; and West German Pat. No. 854,890, etc.

The posi-type photosensitive composition according to the present invention may also incorporate a binder component, if desired. For example, there may be employed a novolac resin soluble in an aqueous alkali solution as a preferable binder resin. Typical examples of such a novolac resin are a phenol-formaldehyde resin, a cresol-formaldehyde resin, a p-tert-butylphenol-formaldehyde resin, a phenol-modified xylene resin and the like.

A quinonediazide compound may be contained preferably in an amount of 10 to 50% by weight, more preferably 20 to 40% by weight based on the total composition. The above binder component may be formulated preferably in an amount of 45 to 80% by weight, preferably 50 to 70% by weight based on the total composition.

The compound represented by the above formula (I) to be used in combination with a quinonediazide compound in the present invention may include gallic acid and all kinds of gallic acid derivatives such as those mentioned below. That is, typical examples are gallic acid, methyl gallate, ethyl gallate, i-propyl gallate, t-butyl gallate, lauryl gallate, stearyl gallate, benzyl gallate, phenyl gallate, cyclohexyl gallate, tannic acid, digallic acid, potassium gallate and the like. Among them, the compound especially preferred in the present invention are gallic acid, methyl gallate and ethyl gallate. The above compound may be added suitably in an amount of 0.5 to 20%, more preferably 1 to 7% by weight, based on the total composition.

The compound represented by the formula (II) to be used in combination with a quinonediazide compound in the present invention may include 1,4-naphthoquinone and all kinds of 1,4-naphthoquinone derivatives such as those mentioned below. That is, typical examples are 1,4-naphthoquinone, 2-methyl-1,4-naphthoquinone, 2-ethyl-1,4-naphthoquinone, 2-propyl-1,4-naphthoquinone, 2,3-dimethyl-1,4-naphthoquinone, 2,5-dimethyl-1,4-naphthoquinone, 2-methoxy-1,4-naphthoquinone, 2-phenyl-1,4-naphthoquinone, 2-(p-tolyl)-1,4-naphthoquinone, 2-acetyl-1,4-naphthoquinone, 3-chloro-1,4-naphthoquinone, 6-chloro-1,4-naphthoquinone, 6-bromo-1,4-naphthoquinone, 6-nitro-1,4-naphthoquinone, 2-hydroxy-1,4-naphthoquinone and the like. One kind of these compounds or a mixture of two or more kinds may be used, optionally in combination with other sensitizers. Among these compounds, particularly preferred compounds are 1,4-naphthoquinone, 2-methyl-1,4-naphthoquinone and 6-chloro-1,4-naphthoquinone.

The compound represented by the formula (II) may be added suitably in an amount of 0.5 to 20% by weight, more preferably 1 to 7% by weight, based on the total composition.

The sensitizer represented by the formula (I) and the sensitizer represented by the formula (II) may be added in combination to a quinonediazide compound in the present invention. In such a case, the amount of the combined compounds to be used ranges from 0.5 to 20%, more preferably from 1 to 10% by weight based on the total composition. The posi-type photosensitive composition according to the present invention may further contain fillers, dyestuffs, dyes, pigments, photolytic acid generater, 1,2-naphthoquinone-(2)-4-sulfonic acid chloride, surfactants for improvement of coating characteristics and other conventional additives and aids. These additives may be added in amounts, which will vary depending on the additives employed but are generally within the range of from 0.01 to 20% by weight, preferably from 0.05 to 10% by weight based on the total composition. The dyes preferably used in the present invention may include basic dyes and oil-soluble dyes. More specifically, there may be employed basic dyes such as Victoria Pure Blue BOH, Victoria Blue BH, Methyl Violet, Eisen Malachite Green (all produced by Hodogaya Kagaku Co., Ltd.), Patent Pure Blue VX, Rhodamine B, Methylene Blue (all produced by Sumitomo Chemical Co., Ltd.) and oil-soluble dyes such as Sudan Blue II, Victoria Blue F4R (all produced by B.A.S.F.), Oil Blue #603, Oil Blue BOS, and Oil Blue II N (all produced by Orient Kagaku Co., Ltd.).

The photosensitive composition according to the present invention is coated and dried on a suitable support such as aluminum plate, copper plate, chromium-plated iron plate, plastic film, paper, bimetal, trimetal, copper-plastic plate for printed wiring, a laminated plate such as a glass plate having vapor deposited chromium oxide, before it is provided for various uses. The support may also be subjected to mechanical or chemical surface treatment for improvement of adhesiveness prior to application of the coating.

The photosensitive composition according to the present invention is dissolved in various organic solvents before it is applied as a coating. As the solvent, there may be used ethylene dichloride, cyclohexanone, methyl ethyl ketone, methyl cellosolve, ethyl cellosolve, methyl cellosolve acetate, ethyl cellosolve acetate, dioxane, ethyl acetate, dimethylformamide, etc. They may be employed either alone or in a mixture. The solid content in the above coating solution may desirably be in the range of from 1 to 50% by weight. The coating quantity, which may also vary depending on uses, is generally in the range of from 0.5 to 3.0 g/m$^2$ as solids. As the coating technique, all coating techniques known in the art may be available.

The thus prepared photosensitive material can be used according to conventional methods. For example, a transparent original having line images or dot images may be contacted on the photosensitive surface and exposed to light, and then the exposed material is developed with an aqueous alkali solution to obtain a posi-type relief image corresponding to the original. As a light source suitable for exposure, there may be employed a mercury lamp, a metal halide lamp, a Xenon lamp, a chemical lamp, a carbon arc lamp, etc. An aqueous alkali solution to be employed may include an aqueous alkali solution such as of sodium silicate, potassium silicate, sodium hydroxide, potassium hydroxide, sodium tertiary phosphate, sodium secondary phosphate, sodium carbonate, potassium carbonate, etc. Such an aqueous alkali solution may contain an alkali at a concentration, which may differ depending on the photosensitive composition and the alkali employed but is suitably within the range generally of from 0.1 to 10% by weight. It is also possible to add a surfactant or an organic solvent such as an alcohol, if desired.

The photosensitive material using the photosensitive composition according to the present invention, especially lithographic printing plate, has higher sensitivity than those using posi-type photosensitive compositions of prior art, and therefore exposure time can be shortened to result in improvement of working performance. In the case of using the sensitizer represented by the formula (I), it is also possible to suppress color formation at halftone portions and color formation at fringes of dot portions in an alkaline developer which are inherent in a posi-type photosensitive composition containing a quinonediazide compound, whereby sharp line images and dot images with so called good foot contrast can be reproduced. And perhaps as the result of such phenomena, exposure of light by means of a gray scale can also be effected with reduction of number of steps at the halftone portion. And smaller dots can be obtained in comparison with the case of using no sensitizer represented by the formula (I). In the case of using the sensitizer represented by the formula (II), larger dots can be obtained in comparison with the case of using no sensitizer represented by the formula (II). Therefore, in the case of using the sensitizer represented by the formula (I) and the sensitizer represented by the formula (II) in combination, desirable dots can be obtained.

As described above, the photosensitive material using the photosensitive composition according to the present invention, especially the lithographic printing plate, is very useful and endowed with characteristics which cannot be attained with other photosensitive compositions.

The following Examples are set forth for illustration of the present invention, but the embodiments of the present invention are not limited thereto.

EXAMPLE 1

| | |
|---|---|
| Esterification product between naphthoquinone-1,2-diazide-5-sulfonyl chloride and resorcin-benzaldehyde resin | 3.00 g |
| Cresol-novolac resin | 9.00 g |
| Gallic acid | 0.36 g |
| Victoria Pure Blue BOH (dye, produced by Hodogaya Kagaku Kogyo Co., Ltd.) | 0.12 g |
| Methyl cellosolve | 100.00 g |

A photosensitive coating solution having the above composition was coated on an aluminum plate which was electrochemically roughened on its surface and anodically oxidized. The film weight after drying was 2.5 g/m$^2$.

With a positive transparent original being contacted on the surface of the thus prepared photosensitive plate, light exposure was effected thereon by a 2 KW metal halide lamp at a distance of 70 cm for 60 seconds and developing was performed with a 2% aqueous sodium metasilicate solution at 25° C. for 45 seconds. The optimum exposure time was determined as the point when five steps in the gray scale at gradations with difference in density of 0.15 (Sakura Step Tablet Type TPS-A) became completely clear. At the same time, light exposure was also performed through a dot scale of 150 lines/inch (Sakura Step Tablet Type TPS-B) to observe reproducibility of dot area on the photosensitive plate (hereinafter referred to as dot reproducibility). The percentage of dot area on the photosensitive plate corresponding to area percentage of 49% of dot area on the original was measured by a dot analysis device (Sakura Areadak-1000) to be 37.3%.

The time at which clear step change in the above gray scale became within one step in a 2% aqueous sodium metasilicate solution at 25° C. (hereinafter called as development tolerance) was found to be within 6 minutes.

When printing was performed by an off-set printer using the thus prepared printing plate, there were obtained a large number of printed products with good images.

COMPARATIVE EXAMPLE 1

A photosensitive plate was prepared in the same manner as in Example 1 except that gallic acid was omitted from the photosensitive coating solution employed in Example 1.

The thus prepared photosensitive plate was subjected to exposure under the same conditions as in Example 1 and developing was performed with a 2% aqueous sodium metasilicate solution under the same conditions as in Example 1. The point at which five steps in the gray scale with differences in density of 0.15 became completely clear (optimum exposure time) under the same test conditions was 125 seconds.

As apparently seen from the results of the above Example 1 and Comparative example 1, photosensitivity was increased by about 2 times greater than by addition of gallic acid into the photosensitive layer.

The dot area percentage on the photosensitive plate was also measured by means of the same dot scale as used in Example 1 to be 40.2%.

Thus, it can be seen that smaller dots were obtained (increased dot reduction effect) by about 3% by addition of gallic acid as shown in Example 1 as compared with the case of Comparative example 1 in which no gallic acid is added.

The development tolerance of the photosensitive plate according to the above Comparative example 1 with the use of a 2% aqueous sodium metasilicate solution was found to be within 6 minutes, similarly as in Example 1. Thus, no deleterious effect can be seen by addition of gallic acid according to the present invention.

COMPARATIVE EXAMPLE 2

| | |
|---|---|
| Esterification product between naphthoquinone-1,2-diazide-5-sulfonyl chloride and pyrogallol-acetone resin (as disclosed in Example 1 in U.S. Pat. No. 3,635,709) | 0.30 g |
| Cresol-novolac resin | 0.97 g |
| Tetrahydrophthalic anhydride | 0.05 g |
| Addition product between benzyl alcohol and Coronate L (Nippon Polyurethane Kogyo Co., Ltd.) [Coronate L: polyisocyanate compound having added 3 moles of toluene diisocyanate to one mole of trimethylolpropane] | 0.03 g |
| Oil Blue #603 (dye, produced by Orient Kagaku, Co., Ltd.) | 0.01 g |
| Ethylene dichloride | 10.00 g |
| 2-Methoxyethyl acetate | 10.00 g |

A photosensitive coating solution with the above composition (see Example 1 in Japanese Provisional Patent Publication No. 80022/1977) was coated on an aluminum plate which was electrochemically roughened on its surface and anodically oxidized. The film weight after drying was 2.3 g/m².

The thus prepared photosensitive plate was subjected to light exposure under the same conditions as in Example 1 and developed with a 2% aqueous sodium metasilicate solution under the same conditions as in Example 1. Under the same test conditions, the point at which five steps in the gray scale with density differences of 0.15 became completely clear (optimum exposure time) was 85 seconds. Dot area percentage was also measured by means of the same dot scale as in Example 1 to be 39.6%.

The development tolerance in a 2% aqueous sodium metasilicate solution at 25° C. was within 4 minutes.

As apparently seen from the above results, while such a system having a cyclic acid anhydride incorporated therein can be improved clearly in photosensitivity, but its effect is smaller than the compound of the present invention and the influence on the development tolerance cannot also be disregarded.

COMPARATIVE EXAMPLE 3

| | |
|---|---|
| Esterification product between 1 mole of 2,3,4-trihydroxybenzophenone and 3 moles of naphthoquinone-1,2-diazide-5-sulfonyl chloride | 0.73 g |
| Esterification product between 1 mole of 2,2'-dihydroxy-dinaphthyl-(1,1')-methane and 2 moles of naphthoquinone-1,2-diazide-5-sulfonyl chloride | 0.55 g |
| Naphthoquinone-1,2-diazide-4-sulfonyl chloride | 0.17 g |
| Cresol-formaldehyde-novolac resin (softening point: 105–120° C.) | 5.33 g |
| Crystal Violet (dye, produced by B.A.S.F.) | 0.06 g |
| Condensation product between 2,3,4-trihydroxybenzophenone and formaldehyde | 0.68 g |
| Methyl cellosolve | 40.00 g |
| Tetrahydrofuran | 50.00 g |
| Butyl acetate | 10.00 g |

A photosensitive coating solution having the above composition (see Example 1 in Japanese Provisional Patent Publication No. 73045/1980) was coated on an aluminum plate which was electrochemically roughened on its surface and anodically oxidized. The film weight after drying was 2.5 g/m².

The thus prepared photosensitive plate was subjected to light exposure under the same conditions as in Example 1 and developed with a 2% aqueous sodium metasilicate solution under the same conditions as in Example 1. Under the same test conditions, the point at which five steps in the gray scale with density differences of 0.15 became completely clear (optimum exposure time) was 100 seconds. Dot area percentage was also measured by means of the same dot scale as in Example 1 to be 40.7%. The development tolerance in a 2% aqueous sodium metasilicate solution at 25° C. was within 6 minutes.

As apparently seen from the above results, while addition of such a hydroxybenzophenone-formaldehyde resin has little influence on development tolerance, the improvement of sensitivity is noticeably smaller than the effect attained by the compound of the present invention.

EXAMPLE 2

| | |
|---|---|
| Esterification product between naphthoquinone-1,2-diazide-5-sulfonyl chloride and m-creosol-formaldehyde resin (see Example 3 in Japanese Patent Publication No. 9610/1970) | 4.00 g |
| Cresol-novolac resin | 8.00 g |
| Ethyl gallate | 0.48 g |
| Victoria Pure Blue BOH (dye, produced by Hodogaya Kagaku Co., Ltd.) | 0.06 g |
| Oil Blue 2N (dye, produced by Orient Kagaku Kogyo Co., Ltd.) | 0.04 g |
| Ethyl cellosolve | 100.00 g |

A photosensitive coating solution was applied on the same electrochemically abraded and anodically oxidized aluminum plate as used in Example 1 to a film weight after drying of 2.3 g/m².

Similarly as in Example 1, the thus prepared photosensitive plate was examined for its optimum exposure time and development tolerance. As the result, it was found that the optimum exposure time was 68 seconds and the development tolerance within 6 minutes. The dot reproducibility on the photosensitive plate by means of the same dot scale as in Example 1 was measured to be 37.9%.

When printing was performed by an off-set printer with the use of the printing plate as prepared above, there were obtained a large number of printed products with good images which are sharp and well contrasted.

EXAMPLE 3

| | |
|---|---|
| Esterification product between naphthoquinone-1,2-diazide-5-sulfonyl chloride and resorcin-benzaldehyde resin | 3.50 g |
| Cresol-phenol vovolac resin | 8.50 g |
| Potassium gallate | 0.33 g |
| Oil Blue #603 (dye, produced by Orient Kagaku Co., Ltd.) | 0.07 g |
| Crystal Violet (dye, produced by B.A.S.F.) | 0.07 g |
| Methyl cellosolve | 90.00 g |
| Cyclohexanone | 10.00 g |

A photosensitive coating solution having the above composition was applied on an aluminum plate which was mechanically roughened on its surface with a nylon brush and anodically oxidized. The film weight after drying was 2.1 g/m².

The thus prepared photosensitive plate was examined similarly as in Example 1 for its optimum exposure time and development tolerance. As the result, it was found that the optimum exposure time was 65 seconds and the development tolerance within 6 minutes. The dot reproducibility on the photosensitive plate was also measured by means of the same dot scale as used in Example 1 to be 37.5%.

When printing was performed by an off-set printer with the use of the printing plate as prepared above, there were obtained a large number of printed products with good images which were sharp and well contrasted.

EXAMPLE 4

| | |
|---|---|
| Esterification product between naphthoquinone-1,2-diazide-5-sulfonyl chloride and resorcin-benzaldehyde resin | 3.00 g |
| Cresol-novolac resin | 9.00 g |
| 1,4-Naphthoquinone | 0.36 g |
| Victoria Pure Blue BOH (dye, produced by Hodogaya Kagaku Kogyo Co., Ltd.) | 0.12 g |
| Methyl cellosolve | 100.00 g |

A photosensitive coating solution having the above composition was coated on an aluminum plate which was electrochemically roughened on its surface and anodically oxidized. The film weight after drying was 2.5 g/m².

With a positive transparent original being contacted on the surface of the thus prepared photosensitive plate, light exposure was effected thereon by a 2 KW metal halide lamp at a distance of 70 cm for 62 seconds and developing was performed with a 2% aqueous sodium metasilicate solution at 25° C. for 45 seconds. The optimum exposure time was determined as the point when five steps in the gray scale at gradations with difference in density of 0.15 (Sakura Step Tablet Type TPS-A) became completely clear. At the same time, light exposure was also performed through a dot scale of 150 lines/inch (Sakura Step Tablet Type TPS-B) to observe reproducibility of dot area on the photosensitive plate (hereinafter referred to as dot reproducibility). The percentage of dot area on the photosensitive plate corresponding to area percentage of 49% of dot area on the original was measured by a dot analysis device (Sakura Areadak-1000) to be 42.8%.

The time at which clear step change in the above gray scale became within one step in a 2% aqueous sodium metasilicate solution at 25° C. (hereinafter called as development tolerance) was found to be within 6 minutes.

When printing was performed by an off-set printer using the thus prepared printing plate, there were obtain a large number of printed product with good images.

As apparently seen from the results of the above mentioned and Comparative example 1, photosensitivity was increased by about 2 times greater than by addition of 1,4-naphthoquinone into the photosensitive layer.

Thus, it can be seen that larger dots were obtained by about 3% (decreased dot reduction effect) by addition of 1,4-naphthoquinone as compared with the case of Comparative example 1 in which no 1,4-naphthoquinone was added.

EXAMPLE 5

| | |
|---|---|
| Esterification product between naphthoquidide-1,2-diazide-5-sulfonyl chloride and m-cresol-formaldehyde resin (see Example 3 in Japanese Patent Publication No. 9610/1970) | 4.00 g |
| Cresol-novalac resin | 8.00 g |
| 2-methyl-1,4-naphthoquinone | 0.48 g |
| Victoria Pure Blue BOH (dye, produced by Hodogaya Kagaku Co., Ltd.) | 0.06 g |
| Oil Blue 2N (dye, produced by Orient Kagaku Kogyo Co., Ltd.) | 0.04 g |

| | |
|---|---|
| -continued | |
| Ethyl cellosolve | 100.00 g |

A photosensitive coating solution was applied on the same electrochemically abraded and anodically oxidized aluminum plate as used in Example 1 to a film weight after drying of 2.3 g/m².

Similarly as in Example 4, the thus prepared photosensitive plate was examined for its optimum exposure time and development tolerance.

As the result, it was found that the optimum exposure time was 65 seconds and the development tolerance within 6 minutes. The dot reproducibility on the photosensitive plate by means of the same dot scale as in Example 1 was measured to be 43.0%.

When printing was performed by an off-set printer with the use of the printing plate as prepared above, there were obtained a large number of printed products with good images.

EXAMPLE 6

| | |
|---|---|
| Esterification product between naphthoquinone-1,2-diazide-5-sulfonyl chloride and resorcin-benzaldehyde resin | 3.50 g |
| Cresol-phenol-novolac resin | 8.50 g |
| 6-Chloro-1,4-naphthoquinone | 0.33 g |
| Oil Blue #603 (dye, produced by Orient Kagaku Co., Ltd.) | 0.07 g |
| Crystal Violet (dye, produced by B.A.S.F.) | 0.07 g |
| Methyl cellosolve | 90.00 g |
| Cyclohexanone | 10.00 g |

A photosensitive coating solution having the above composition was applied on an aluminum plate which was mechanically roughened on its surface with a nylon brush and anodically oxidized. The film weight after drying was 2.1 g/m².

The thus prepared photosensitive plate was examined similarly as in Example 4 for its optimum exposure time and development tolerance. As the result, it was found that the optimum exposure time was 59 seconds and the development tolerance within 6 minutes. The dot reproducibility on the photosensitive plate was also measured by means of the same dot scale as used in Example 4 to be 42.1%.

When printing was performed by an off-set printer with the use of the printing plate as prepared above, there were obtained a larger number of printed products with good images.

We claim:

1. A posi-type photosensitive composition, comprising 10 to 50% by weight of a quinonediazide posi-type photosensitive compound and 0.5 to 20% by weight of at least one sensitizer represented by formula (I) or (II):

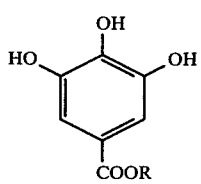

(I)

wherein R is selected from the group consisting of a hydrogen atom, an alkyl group, an aralkyl group, an aryl group, a substituted aryl group, a cycloalkyl group, and an alkali metal atom;

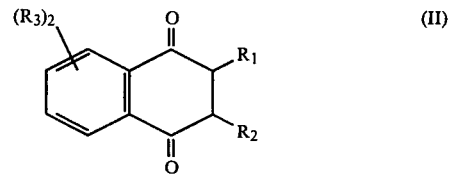

(II)

wherein each of $R_1$, $R_2$ and $R_3$ is selected from the group consisting of a hydrogen atom, an alkyl group, an alkoxy group, an aryl group, a substituted aryl group, an acyl group, a halogen atom, a nitro group and a hydroxyl group and wherein said $R_3$ groups may be either identical or different groups.

2. The posi-type photosensitive composition of claim 1, wherein said substituted aryl group has at least one substituent selected from the group consisting of a lower alkyl group having one to four carbon atoms, a lower alkoxy group having one to four carbon atoms, a lower acyl group having one to four carbon atoms, a halogen atom, a nitro group, a hydroxyl group and a carboxyl group.

3. The posi-type photosensitive composition of claim 1 further comprising 45 to 80% by weight of a binder resin.

4. The posi-type photosensitive composition of claim 1, wherein said quinonediazide compound is present in an amount of between 20 to 40% by weight and said sensitizer is present in an amount of between 1 to 7% by weight.

5. The posi-type photosensitive composition of claim 4 further comprising 50 to 70% by weight of a binder resin.

6. The posi-type photosensitive composition of claim 1, wherein the photosensitive compound is selected from the group consisting of an ester of 1,2-diazonaphthoquinonesulfonyl chloride with a phenolic hydroxyl group containing compound and an amide of 1,2-diazonaphthoquinonesulfonyl chloride with an aromatic amine.

7. The posi-type photosensitive composition of claim 1, wherein the quinonediazide type posi-type photosensitive compound is selected from the group consisting of an ester of 1,2-diazonaphthoquinonesulfonyl chloride with polyhydroxyphenyl, an ester of 1,2-diazonaphthoquinonesulfonyl chloride with resorcinbenzaldehyde resin, and an ester of 1,2-diazobenzoquinonesulfonyl chloride or 1,2-diazonaphthoquinonesulfonyl chloride with a phenol-formaldehyde resin.

8. The posi-type photosensitive composition of claim 7, wherein the quinonediazide type posi-type photosensitive compound is an ester of 1,2-diazonaphthoquinonesulfonyl chloride with polyhydroxyphenyl or an ester of 1,2-diazonaphthoquinonesulfonylchloride with resorcin-benzaldehyde resin.

9. The posi-type photosensitive composition of claim 1, wherein the sensitizer is at least one compound of formula (I).

10. The posi-type photosensitive composition of claim 9, wherein the sensitizer is selected from the group consisting of gallic acid, methyl gallate, ethyl gallate, i-propyl gallate, t-butyl gallate, lauryl gallate, stearyl gallate, benzyl gallate, phenyl gallate, cyclohexyl gallate, tannic acid, digallic acid and potassium gallate.

11. The posi-type photosensitive composition of claim 10, wherein the sensitizer is gallic acid, methyl gallate or ethyl gallate.

12. The posi-type photosensitive composition of claim 1, wherein the sensitizer is at least one compound of formula (II).

13. The posi-type photosensitive composition of claim 12, wherein the sensitizer is selected from the group consisting of 1,4-naphthoquinone, 2-methyl-1,4-naphthoquinone, 2-ethyl-1,4-naphthoquinone, 2-propyl-1,4-naphthoquinone, 2,3-dimethyl-1,4-naphthoquinone, 2,5-dimethyl-1,4-naphthoquinone, 2-methoxy-1,4-naphthoquinone, 2-phenyl-1,4-naphthoquinone, 2-(p-tolyl)-1,4-naphthoquinone, 2-acetyl-1,4-naphthoquinone, 3-chloro-1,4-naphthoquinone, 6-chloro-1,4-naphthoquinone, 6-bromo-1,4-naphthoquinone, 6-nitro-1,4-naphthoquinone and 2-hydroxy-1,4-naphthoquinone.

14. The posi-type photosensitive composition of claim 13, wherein the sensitizer is 1,4-naphthoquinone, 2-methyl-1,4-naphthoquinone or 6-chloro-1,4-naphthoquinone.

15. The posi-type photosensitive composition according to claim 1, further comprising an additive.

16. The posi-type photosensitive composition of claim 15, wherein the additive is a basic dye or an oil-soluble dye.

17. The posi-type photosensitive composition of claim 3, wherein the binder resin is selected from the group consisting of a phenol-formaldehyde resin, a cresolformaldehyde resin, a p-tert-butylphenol-formaldehyde resin, and a phenol-modified xylene resin.

18. A posi-type photosensitive material, comprising a support and the photosensitive composition of claim 1 thereon.

* * * * *